(12) United States Patent
Ramabadran et al.

(10) Patent No.: US 9,495,492 B1
(45) Date of Patent: Nov. 15, 2016

(54) IMPLEMENTING SYNCHRONOUS TRIGGERS FOR WAVEFORM CAPTURE IN AN FPGA PROTOTYPING SYSTEM

(71) Applicant: Cadence Design Systems, Inc., San Jose, CA (US)

(72) Inventors: Vasant V. Ramabadran, San Jose, CA (US); Akash Sharma, Noida (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 68 days.

(21) Appl. No.: 14/589,288

(22) Filed: Jan. 5, 2015

(51) Int. Cl.
*G06F 17/50* (2006.01)
*G01R 31/3183* (2006.01)
*G06F 11/277* (2006.01)
*H03K 19/173* (2006.01)
*G06F 11/263* (2006.01)
*H03K 19/177* (2006.01)

(52) U.S. Cl.
CPC ....... *G06F 17/5031* (2013.01); *G06F 17/5081* (2013.01); *G01R 31/318342* (2013.01); *G01R 31/318364* (2013.01); *G06F 11/263* (2013.01); *G06F 11/277* (2013.01); *G06F 17/5022* (2013.01); *G06F 17/5027* (2013.01); *G06F 17/5054* (2013.01); *H03K 19/1737* (2013.01); *H03K 19/17744* (2013.01)

(58) Field of Classification Search
CPC ........... G06F 17/5022; G06F 17/5027; G06F 17/5054; G06F 11/263; G06F 11/277; G01R 31/318364; G01R 31/318342; H03K 19/1737; H03K 19/17744; H04R 1/406; H04R 2201/40
See application file for complete search history.

(56) References Cited

U.S. PATENT DOCUMENTS

| | | | |
|---|---|---|---|
| 5,109,353 A | 4/1992 | Sample et al. | |
| 5,329,470 A | 7/1994 | Sample et al. | |
| 5,406,627 A * | 4/1995 | Thompson | H04K 1/02 348/E7.055 |
| 5,425,036 A | 6/1995 | Liu et al. | |
| 5,448,496 A | 9/1995 | Butts et al. | |
| 5,452,231 A | 9/1995 | Butts et al. | |
| 5,452,239 A | 9/1995 | Dai et al. | |
| 5,475,830 A | 12/1995 | Chen et al. | |
| 5,477,475 A | 12/1995 | Sample et al. | |
| 5,649,167 A * | 7/1997 | Chen | A21B 1/245 703/23 |
| 5,661,662 A | 8/1997 | Butts et al. | |
| 5,761,484 A * | 6/1998 | Agarwal | G06F 17/5027 326/38 |
| 5,812,414 A | 9/1998 | Butts et al. | |
| 5,821,773 A | 10/1998 | Norman et al. | |
| 5,831,866 A * | 11/1998 | Burgun | G06F 17/505 714/725 |
| 5,841,967 A | 11/1998 | Sample et al. | |
| 5,943,490 A | 8/1999 | Sample | |
| 5,960,191 A | 9/1999 | Sample et al. | |
| 5,963,735 A | 10/1999 | Sample et al. | |

(Continued)

*Primary Examiner* — Helen Rossoshek
(74) *Attorney, Agent, or Firm* — Kaye Scholer LLP

(57) ABSTRACT

An apparatus and method for implementing synchronous triggers for waveform capture in a multiple FPGA system is described. The apparatus includes trigger net circuitry that has one or more trigger nets and an output. Furthermore, a plurality of programmable logic devices are provided with each logic device including logic circuitry that is programmable to correspond to a circuit design, a logic analyzer circuit that includes logic connections coupled to the logic circuitry to monitor operating signals of the circuit design, and a register with a data input that is coupled to the output of the trigger net circuitry and an output that is coupled to a control input of the logic analyzer circuit. The trigger net circuitry outputs a control signal that is applied to all registers such that each logic analyzer circuit is controlled to concurrently capture data waveforms.

19 Claims, 3 Drawing Sheets

(56) References Cited

U.S. PATENT DOCUMENTS

| | | | |
|---|---|---|---|
| 6,020,760 A | 2/2000 | Sample et al. | |
| 6,058,492 A * | 5/2000 | Sample | G06F 17/5027 714/33 |
| 6,347,387 B1 * | 2/2002 | Fischer | G06F 11/277 714/735 |
| 6,377,911 B1 | 4/2002 | Sample et al. | |
| 6,377,912 B1 * | 4/2002 | Sample | G01R 31/2853 703/28 |
| 6,438,735 B1 * | 8/2002 | McElvain | G06F 17/5045 716/103 |
| 6,446,249 B1 | 9/2002 | Wang et al. | |
| 6,625,793 B2 | 9/2003 | Sample et al. | |
| 6,697,957 B1 * | 2/2004 | Wang | G06F 17/5027 713/1 |
| 6,832,185 B1 | 12/2004 | Musselman et al. | |
| 6,842,729 B2 | 1/2005 | Sample et al. | |
| 6,882,176 B1 | 4/2005 | Norman et al. | |
| 6,915,323 B1 * | 7/2005 | Chang | H03K 19/1737 708/707 |
| 7,185,293 B1 * | 2/2007 | Ofer | G06F 17/5054 326/38 |
| 7,260,794 B2 | 8/2007 | Butts | |
| 7,323,771 B2 * | 1/2008 | Fujita | G06F 11/261 257/691 |
| 7,379,861 B2 | 5/2008 | Kfir et al. | |
| 7,398,445 B2 * | 7/2008 | Ng | G01R 31/3016 703/13 |
| 7,739,097 B2 * | 6/2010 | Sample | G01R 31/2853 370/546 |
| 7,904,859 B2 * | 3/2011 | Maixner | G06F 17/5027 327/161 |
| 7,908,574 B2 * | 3/2011 | Larouche | G06F 17/5027 716/100 |
| 7,949,907 B2 * | 5/2011 | Kodavalla | H03K 19/17744 714/700 |
| 7,984,400 B2 * | 7/2011 | Maixner | G06F 17/5027 703/13 |
| 8,392,859 B2 * | 3/2013 | Ng | G01R 31/3016 703/13 |
| 8,595,683 B1 * | 11/2013 | de Buren | G06F 17/5054 326/37 |
| 8,904,333 B2 * | 12/2014 | Bai | G06F 17/5054 716/112 |
| 9,294,094 B1 * | 3/2016 | Ramabadran | G06F 17/5054 |
| 2003/0200070 A1 * | 10/2003 | Elliott | G06F 17/5022 703/14 |
| 2004/0230934 A1 * | 11/2004 | Taylor | G06F 17/5027 326/38 |
| 2008/0092001 A1 * | 4/2008 | Kodavalla | H03K 19/17744 714/731 |
| 2008/0097717 A1 * | 4/2008 | Tokunaga | G01R 31/318516 702/119 |
| 2008/0301601 A1 * | 12/2008 | Ng | G06F 17/5022 716/106 |
| 2009/0150839 A1 * | 6/2009 | Huang | G06F 17/5027 716/106 |
| 2011/0202894 A1 * | 8/2011 | Chang | G06F 17/5027 716/108 |
| 2012/0005547 A1 * | 1/2012 | Chang | G06F 11/261 714/734 |
| 2013/0117007 A1 * | 5/2013 | Chang | G06F 8/20 703/28 |
| 2013/0227509 A1 * | 8/2013 | Chang | G06F 17/5027 716/111 |
| 2015/0135147 A1 * | 5/2015 | Emirian | G06F 17/5027 716/105 |

* cited by examiner

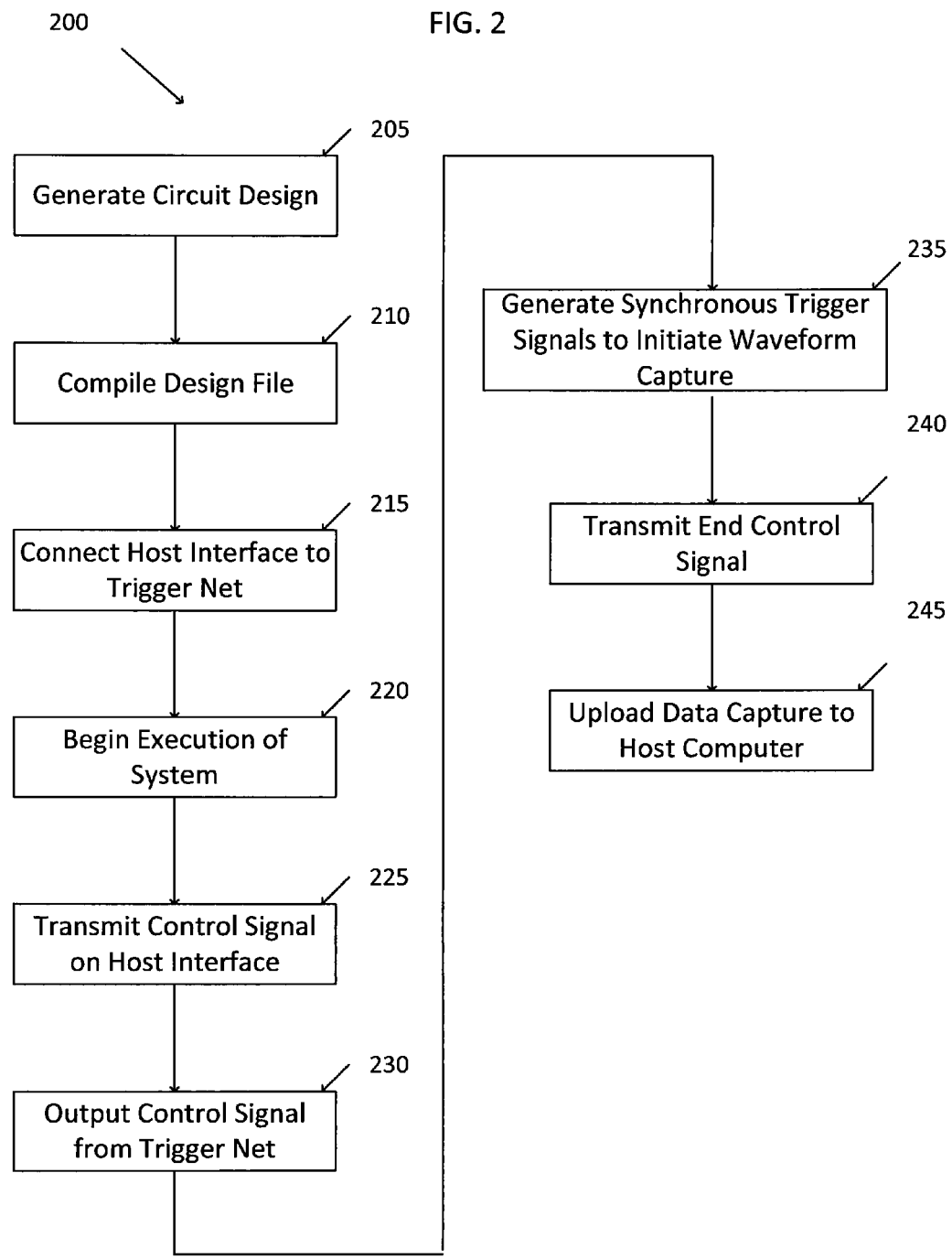

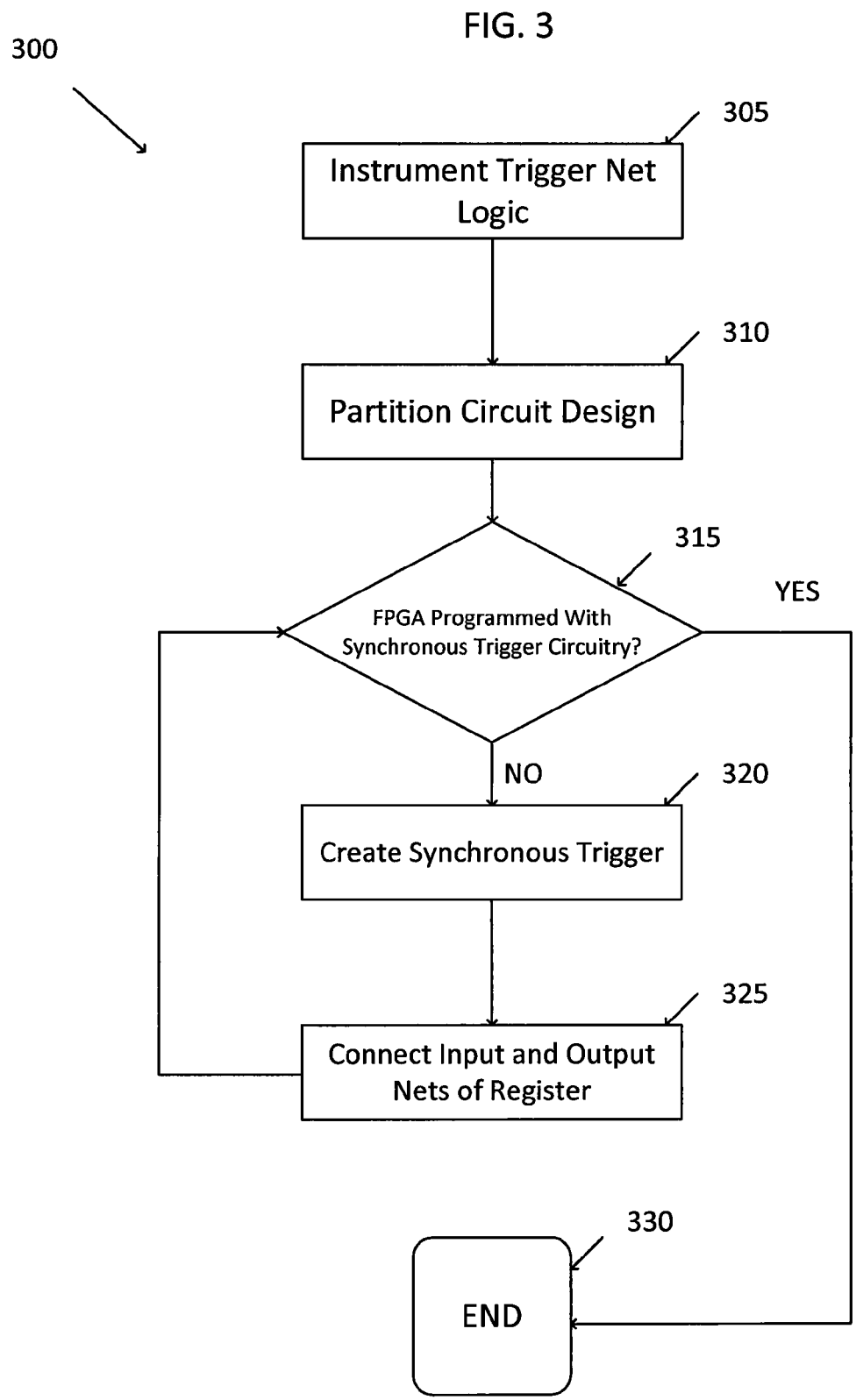

IMPLEMENTING SYNCHRONOUS TRIGGERS FOR WAVEFORM CAPTURE IN AN FPGA PROTOTYPING SYSTEM

FIELD

The present patent document relates generally to functional verification systems for circuit designs. In particular, the present patent document relates to a method and apparatus for implementing synchronous triggers for waveform capture in a multiple FPGA system.

BACKGROUND

Designers of integrated circuit devices ("chips"), generally application-specific integrated circuits ("ASICs"), use prototyping as part of the electronic design automation process prior to manufacture of the chip. Prototyping is one type of hardware-based functional verification that allows the circuit designer to observe the behavior of the circuit design under conditions approximating its final, manufactured performance. During prototyping, a circuit design, generally written in register transfer language ("RTL") code, is programmed into one or more programmable logic chips, frequently field-programmable gate arrays ("FPGA") on a prototyping board. FPGA-based prototypes are a fully functional representation of the circuit design, its circuit board, and its input/output ("I/O") devices. Also, FPGA prototypes generally run at speeds much closer to the clock speed at which the manufactured chip will run than other types of functional verification, e.g., software simulation, thereby allowing for verifying the circuit design under many more conditions in the same amount of time than other verification methods, and in particular, software simulation. The circuit design prototype may also be operated in another electronic circuit, e.g., the electronic circuit for which the design under verification will be used after fabrication, so that the circuit design prototype may be observed and tested in an environment in which the manufactured chip will be used. As such, circuit designers may use FPGA prototyping as a vehicle for software co-development and validation, increasing the speed and accuracy of system developments.

Prototyping of a circuit design using programmable logic chips (e.g., FPGAs) can have advantages over other types of functional verification, namely emulation using a plurality of emulation processors. First, prototyping using programmable logic chips generally results in higher speed relative to emulation using emulation processors. Second, such higher-speed circuit design prototypes using programmable logic chips can sometimes even run in real-time, that is, the prototype may run at the intended clock speed of the manufactured chip, rather than a reduced clock speed. This is not always the case, notably for higher performance circuit designs that have clock speeds higher than the maximum allowed by the programmable logic chips. Third, such prototyping systems using programmable logic chips are generally of lower cost than an emulation system using processors.

Exemplary hardware used in prototyping comprises FPGAs or other types of programmable logic chips, input/output circuitry, and interconnect circuitry connecting the programmable logic chips to each other and to the input-output circuitry. An example of commercial prototyping hardware includes the DN7006K1 OPCIe-8T manufactured by the DINI Group of La Jolla, Calif. The DN7006K10PCIe-8T features six Altera Stratix 3 3SL340 (FF1760) FPGAs, a configuration FPGA, global clock generation hardware, interconnect connecting the FPGAs to each other, input/output devices including an eight lane PCI Express Endpoint, and DDR SODIMM slots for the insertion of RAM.

To enable a circuit designer to evaluate the circuit design prototype, FPGAs are generally embedded with an internal logic analyzer circuit that can capture and store logic signals during operation. Each internal logic analyzer can be triggered on a combination of multiple signals from the user logic. Once these signals are captured, the internal logic analyzer can unload the data through an interface to a computer. Typically, an interface is connected between the computer and the FPGA where the computer can arm the internal logic analyzer and poll it until a data acquisition has been made. While internal logic analyzers work well for debugging logic of each individual FPGA, existing designs have limitations for multiple FPGA systems. Specifically, each logic analyzer captures data waveforms for its respective FPGA independently of the other FPGAs in the system. This design limitation leads to confusion and loss of correct and efficient debugging for circuit design prototypes that include multiple FPGAs.

SUMMARY

Accordingly, an apparatus and method is disclosed to implement synchronous triggers for waveform capture in a multiple FPGA system. The disclosed apparatus and method enable internal logic analyzers of each FPGA to synchronously capture waveforms from the device when it is operating and under the actual conditions that might produce a malfunction of the circuit design prototype.

According to an embodiment, an apparatus is provided for synchronizing triggers for waveform capture of a circuit design in a prototyping system. The apparatus comprises trigger net circuitry including at least one trigger net and an output and a plurality of programmable logic devices. Each programmable device includes logic circuitry programmable to correspond to the circuit design; a logic analyzer circuit including at least one logic connection coupled to the logic circuitry for monitoring operating signals of the circuit design; and a register having a data input coupled to the output of the trigger net circuitry and an output coupled to a control input of the logic analyzer circuit.

According to an embodiment, one or more of the plurality of programmable logic devices of the apparatus includes the trigger net circuitry.

According to an embodiment, each of the plurality of programmable logic devices of the apparatus is a field-programmable gate array.

According to an embodiment, the trigger net circuitry of the apparatus includes at least one multiplexer with a select input coupled to a host interface of the prototyping system.

According to an embodiment, the host interface is configured to control the trigger net circuitry to potentially output a high logic signal.

According to an embodiment, each register of the plurality of programmable logic devices synchronously outputs a control logic signal to the respective logic analyzer circuit coupled thereto.

According to an embodiment, each logic analyzer circuit of the plurality of programmable logic devices synchronously captures a waveform from the logic circuitry of the respective programmable logic device.

According to an embodiment, each logic analyzer circuit of the plurality of programmable logic devices is programmed to synchronously capture a waveform from the logic circuitry of the respective programmable logic device via the at least one logic connection.

According to an embodiment, a computer-implemented method is provided for synchronizing triggers for waveform capture of a prototyping system. The method includes partitioning a circuit design for programming into a plurality of programmable logic devices; programming one or more of the plurality of programmable logic devices to include trigger net circuitry, the trigger net circuitry including at least one trigger net and an output; programming an input of one register in each of the plurality of programmable logic devices to receive a control signal from the output of the trigger net circuitry; and programming an output of the one register in each of the plurality of programmable logic devices to transmit a trigger signal to a logic analyzer circuit in the respective programmable logic device.

According to an embodiment, the method includes programming at least one logic connection of each logic analyzer circuit to receive at least one operating signal from logic circuitry of the respective programmable logic device.

According to an embodiment, the method includes connecting a host interface of the prototyping system to an input of the trigger net circuitry.

According to an embodiment, the method includes transmitting a control signal on the host interface to the trigger net circuitry to potentially output a high logic signal.

According to an embodiment, the method includes synchronously outputting a control logic signal by each register of the plurality of programmable logic devices to the respective logic analyzer circuit coupled thereto.

According to an embodiment, the method includes synchronously capturing, by each respective logic analyzer circuit, a waveform from the logic circuitry of the respective programmable logic device.

According to an embodiment, a computer-readable non-transitory storage medium is provided having stored thereon a plurality of instructions, the plurality of instructions when executed by a computer, cause the computer to partition a circuit design for programming into a plurality of programmable logic devices; program one or more of the plurality of programmable logic devices to include trigger net circuitry, the trigger net circuitry including at least one trigger net and an output; program an input of one register in each of the plurality of programmable logic devices to receive a control signal from the output of the trigger net circuitry; and program an output of the one register in each of the plurality of programmable logic devices to transmit a trigger signal to a logic analyzer circuit in the respective programmable logic device.

According to an embodiment, the plurality of instructions when executed by a computer further cause the computer to program at least one logic connection of each logic analyzer circuit to receive at least one operating signal from logic circuitry of the respective programmable logic device.

According to an embodiment, the plurality of instructions when executed by a computer further cause the computer to connect a host interface of the prototyping system to an input of the trigger net circuitry.

According to an embodiment, the plurality of instructions when executed by a computer further cause the computer to transmit a control signal on the host interface to the trigger net circuitry to potentially output a high logic signal.

According to an embodiment, the plurality of instructions when executed by a computer further can cause the computer to program each register of the plurality of programmable logic devices to synchronously output a control logic signal to the respective logic analyzer circuit coupled thereto.

According to an embodiment, the plurality of instructions when executed by a computer further cause the computer to synchronously capture, by each respective logic analyzer circuit, a waveform from the logic circuitry of the respective programmable logic device.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

FIG. 2 illustrates a flow diagram of a method for implementing synchronous triggers for waveform capture in a multiple FPGA system.

FIG. 3 illustrates a software flow chart for a method for programming the trigger net logic into FPGAs for the prototyping design according to an exemplary embodiment.

Figure 1:
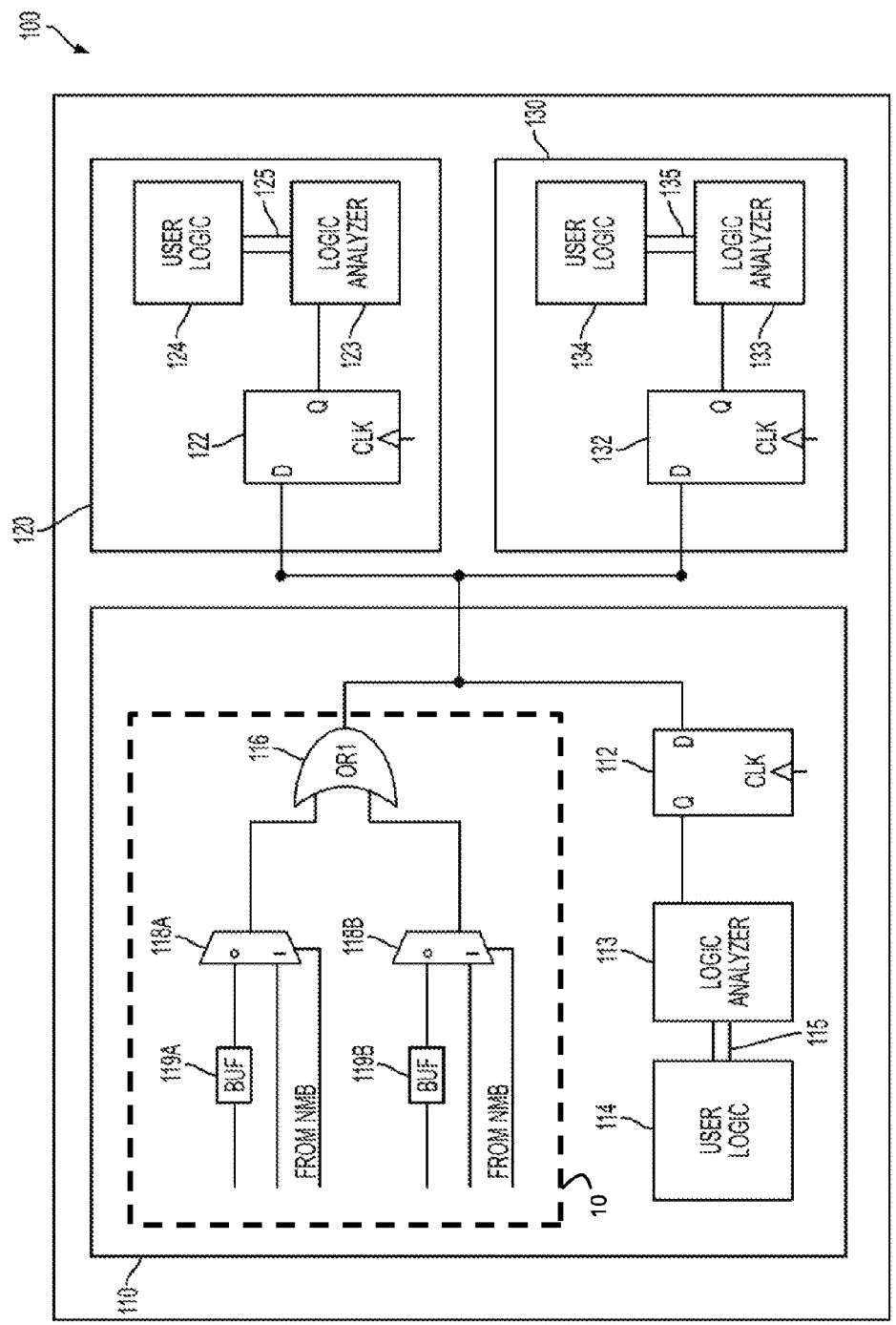
FIG. 1 illustrates an exemplary circuit design partitioned into blocks of circuitry, each configured to synchronously capture data according to an exemplary embodiment.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present patent document also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an exemplary circuit design 100 partitioned into three blocks of circuitry, each configured to synchronously capture data according to an exemplary embodiment. As shown, each block is programmed into one FPGA, shown as FPGA 110, 120 and 130, that are part of an exemplary prototyping system comprising a circuit board that hosts FPGAs, clock generation circuits, interconnect lines connecting the FPGAs to each other, clock generation circuitry, I/O devices for communication to external hardware, connectors, and memory. It should be appreciated that the programmable logic devices used in this embodiment are FPGAs. However, as will be appreciated by one of skill in the art, any number of programmable logic devices suitable for prototyping may be used in place of the FPGAs of the exemplary embodiment.

Partitioning of circuit design 100 may be accomplished using any number of partitioning techniques well-known to those in the field of prototyping. Each of FPGAs 110-130 may host additional circuitry for management, control, and testing functionality that includes internal logic analyzers. Although not shown, it should be appreciated that the circuit design 100 includes signal interconnects between each of FPGAs 110, 120 and 130 for the transmission and receipt of signals to and from the respective FPGAs. Such interconnects include pins of packages containing the FPGAs and conductors routed on the prototype circuit board hosting the FPGAs.

Each of FPGAs 110-130 includes a plurality of registers or flip-flops. In the exemplary embodiment of FIG. 1, FPGAs 110-130 are each shown to include one register 112, 122, and 132 that is utilized by the exemplary system and method to serve as the synchronous trigger during testing of the circuit design prototype. In particular, each register 112, 122, and 132 includes a data input D, a clock input CLK and a data output Q. The output Q of each of these registers is coupled to an internal logic analyzer 113, 123 and 133 on each of the FPGAs 110-130, respectively, with the output signal Q serving as a control signal or "trigger" signal that triggers the respective internal logic analyzers 113, 123 and 133 to begin capturing a waveform of data for its respective FPGA.

In addition, each FPGA 110, 120 and 130 includes user logic 114, 124 and 134 and logical connections 115, 125 and 135 programmed into the FPGAs 110, 120 and 130 communicatively coupled to the internal logic analyzers 113, 123 and 133, respectively. As should be appreciated to those skilled in the art, the user logic can be programmable logic that corresponds to the actual circuit design being evaluated. Moreover, the logical connections 115, 125 and 135 allows signals from user logic to be transmitted to logic analyzer circuits 113, 123 and 133. These signals can include a system clock, signals to monitor and the like. The specific signals to be monitored by the logic analyzer circuits can be specified by the circuit designer. As should be further understood, the logic analyzer circuits each can communicate with an external computer to transmit information including the current status of logic analyzer circuit and data captured from the FPGA. Connections between the logic analyzer circuits and an external computer should be understood to one skilled in the art and are not shown in FIG. 1.

The registers on the FPGAs can collectively be considered synchronized flip flops such that the output Q will output a high logic signal (i.e., a "1") or a low logic signal (i.e., a "0") at the same time as one another. Advantageously, by synchronizing the trigger signals, internal logic analyzers 113, 123 and 133 are controlled to capture waveforms from the user logic at precisely the same time for each FPGA in the circuit design.

The synchronized trigger signal Q of each of the FPGA is controlled based on a synchronized input signal to the data input D. In particular, each of the data inputs D are commonly connected to an output of an OR gate 116 in the FPGA 110. The OR gate 116 is part of control circuitry that synchronously controls all of the logic analyzer circuits in each of the respective FPGAs 110, 120 and 130. In the exemplary embodiment, the control circuitry is programmed on one or more of the FPGAs (shown as programmed on FPGAs 110, 120 and/or 130) and can be considered trigger net circuitry 10 in that it serves as control circuitry to initiate the trigger for synchronous waveform capture by the FPGAs 110, 120 and 130. Specifically, the OR gate 116 can output a control logic signal, such as a high logic signal (i.e., a "1"), that is fed to the data input D of each register 112, 122, and 132. The clock signal CLK controls the output of the registers 112, 122, and 132, such that the data output Q will be driven to a "1" in response to the clock signal CLK. Alternatively, the OR gate 116 can output a low logic signal (i.e., a "0") that is fed to the data input D of each register 112, 122, and 132. The clock signal CLK controls the output of the registers 112, 122, and 132, such that the data output Q will be driven to a "0" in response to the clock signal CLK.

It should be appreciated that this circuitry can be customized and/or controlled by the circuit designer. For example, in one embodiment, the internal logic analyzers 113, 123 and 133 can be controlled to capture waveforms when the OR gate 116 feeds a low logic signal. Furthermore, in the exemplary embodiment, each internal logic analyzers 113, 123 and 133 captures waveforms in response to the trigger signal and continues the data capture until the core of the logic analyzer reaches its capacity for data storage.

As further shown in FIG. 1, the OR gate 116 has two input pins that are coupled to additional logic. In the exemplary embodiment, the additional logic is programmed to define trigger net signals used to initiate the synchronous waveform capture. As shown, the input pins of the OR gate 116 are coupled to first and second multiplexers 118A and 118B, which each include two data input pins and a select input pin. Respective first inputs of each of the multiplexers 118A, 118B are coupled to buffers 119A and 119B whose input receives trigger net signals 1 and 2. These trigger net signals are part of the user logic defined by the user and are enabled and disabled through the multiplexer selection signals. It should be understood that when either multiplexers 118A or multiplexers 118B outputs a high logic signal (i.e., a "1"), the output of the OR gate 116 will be a "1", which serves as the control signal for synchronous trigger signals as discussed above. As further shown, the select signal for the multiplexers 118A and 118B are preferably driven by a connection to the host interface, which is shown as an NMB or main bus coupled to the host interface. This connection enables controls the trigger net signals to initiate the synchronous waveform capture by each FPGA. It should be appreciated that the logic circuitry shown in FIG. 1 to provide the trigger net signals for the synchronous waveform capture is an exemplary embodiment and that variation of this circuitry can be implemented in alternative embodiments.

FIG. 2 illustrates a flow diagram of a method 200 for implementing synchronous triggers for waveform capture in a multiple FPGA system. Initially, at step 205, a designer generates a circuit design for prototyping into an output file. A wide variety of electronic design automation ("EDA") tools can be used to generate and compile the circuit design. Once the circuit is designed, the user issues a compile command at step 210 to compile the user's device design into the prototype circuit design. The exemplary process for compiling the device design to include the trigger net logic 10 disclosed herein will be described in detail below with respect to FIG. 3. However, according to the exemplary embodiment, it should generally be understood that step 210 includes partitioning the user's design onto FPGAs of the prototyping system and programming each FPGA to include at least one register (shown as registers 112, 122 and 132 in the example shown in FIG. 1) used to provide a trigger that is supplied as a control signal to a respective logic analyzer on each FPGA. In addition, programming of the circuit design includes defining and creating a trigger net to provide a control signal for each register of each partitioned FPGA as described above with respect to FIG. 1.

Once the circuit is designed and compiled, the circuit design prototype can then be evaluated by synchronously capturing waveform data. In particular, at step 215, a host interface or bus is connected to the trigger net logic 10 of the circuit design as discussed above with respect to FIG. 1. In one embodiment of the invention, the host interface is connected to an input pin of one of the FPGA's (i.e., the FPGA with the trigger net logic 10) that has been specified by the user during the circuit design of step 205.

Next, at step 220, the circuit designer begins execution of the system in which the circuit design prototype is operating to begin the design evaluation and debugging process. During operation the circuit designer can then initiate the synchronous waveform capture of the FPGAs of the circuit design by transmitting a control signal (step 225) on the host interface to the trigger net circuitry (i.e., the control circuitry) 10 programmed on one of the FPGAs as discussed above. As described above with respect to FIG. 1, the trigger net control signal results in enabling of the trigger signals through the multiplexer which can potentially result in a control logic signal (e.g., a high logic signal "1") from OR gate 116 that is input to each of the registers 112, 122, and 132 of the respective FPGAs. This is shown as step 230 in FIG. 2. At the next clock cycle, the registers 112, 122, and 132 each output a trigger signal at step 235, which is sent to respective logic analyzers 113, 123, and 133, with the trigger signals synchronously controlling the analyzers to begin the desired waveform capture. It should be understood that the waveform capture for each FPGA begins at the same instant, which facilitates a more accurate debugging by the circuit designer as described above. Also, as described above, each internal logic analyzers 113, 123 and 133 captures waveforms in response to the trigger signal and continues the data capture until the core of the logic analyzer reaches its capacity for data storage.

Finally, once data capture is complete by each logic analyzer, the actual data capture by each logic analyzer can be uploaded over a serial interface cable or the like to the circuit designer's host computer (step 240). The circuit designer is then able to graphically view these signals received from the logic analyzers, where the signals can be presented in a waveform view annotated with the names of the signals or the like.

FIG. 3 illustrates a software flow chart for a method 300 for programming the trigger net logic 10 into FPGAs for the prototyping design according to an exemplary embodiment. As described above, the method shown in FIG. 3 corresponds to an exemplary embodiment of step 210 of FIG. 2. Moreover, the prototyping software is run on a workstation, comprising a general purpose processor, RAM, hard-disk or other permanent storage, and input/output devices in electrical communication with a prototyping board comprising FPGAs or other programmable logic chips, input/output circuitry, and interconnect circuitry connecting the programmable logic chips to each other and to the input-output circuitry. In addition, the design file for the circuit design can be in any format suitable for partitioning and programming into programmable logic chips of a prototyping system, for example hardware description language ("HDL") format.

Initially, at step 305, the trigger net logic circuitry 10 is programmed for the circuit design, which can be the trigger net circuitry 10 shown in FIG. 1, for example. Next, at step 310, the circuit design is partitioned into two or more partitions, each partition to be programmed into a distinct FPGA of the prototyping board. As previously discussed, partitioning may be accomplished using any number of techniques well known in the field of prototyping that divide up the logic of the circuit design for programming into a plurality of FPGAs. The software then begins the loop containing steps 315-325 that generates the logic for the synchronous triggers to be programmed into each FPGA hosting a partition. In particular, at decision 315, if each FPGA to be programmed with a partition has already had a register programmed to provide the synchronous control signal to the respective logic analyzer circuit, then the software proceeds to step 330, which is the end of the design process. If not every FPGA to be programmed with a partition has already been programmed with the circuitry, which should be the case the first time decision 315 is encountered by the software, the software proceeds to program the circuitry needed for synchronous waveform capture into a first FPGA of the circuit design at step 320. In particular, step 320 involves designating a register (e.g., register 112 of FIG. 1) in the first FPGA (e.g., FPGA 110 of FIG. 1) for the synchronous waveform capture process. At step 325, the input net of the register 112 is connected to the output of the trigger net (e.g., the output of OR gate 116 of FIG. 1) and the output net of register 112 is connected to the input of the logic analyzer of the FPGA, for example, logic analyzer 113 of FPGA 110.

After step 330 is performed for the first FPGA of the circuit design, the method returns to step 315 to query whether every other FPGA has been programmed to include the circuitry for the synchronous trigger for waveform capture. If the answer is "NO", steps 320 and 325 are performed for the next FPGA in the circuit design. In the exemplary embodiment, this loop is repeated until each partitioned FPGA in the circuit design has been programmed to include the circuitry for synchronous data waveforms according to the exemplary embodiment. It should be appreciated that in an alternative embodiment, only some, but not all, of the FPGAs in the circuit design are programmed to include the synchronous trigger of the exemplary embodiment. Once each desired FPGA of the circuit design is programmed according to steps 320 and 325, step 315 will be answered YES and the method proceeds to step 330, which is the end of the circuit design programming. At this point, the design file is compiled for execution as discussed above with respect to FIG. 2.

Accordingly, it should be appreciated that the apparatus and method disclosed above enable internal logic analyzers of each FPGA in a circuit design prototype to synchronously capture waveforms from the device when it is operating under the actual conditions that might produce a malfunction of the circuit design prototype in order to more efficiently evaluate and debug the circuit design. It is also generally noted that the above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. An apparatus for synchronizing triggers for waveform capture of a circuit design in a prototyping system, the apparatus comprising:
    trigger net circuitry including at least one input for receiving a control signal and an output; and
    a plurality of programmable logic devices each including:
        logic circuitry programmable to correspond to the circuit design;
        a logic analyzer circuit including at least one logic connection coupled to the logic circuitry for monitoring signals of the circuit design; and
        a register having a data input coupled to the output of the trigger net circuitry and an output coupled to a control input of the logic analyzer circuit,
        wherein one of the plurality of programmable logic devices is programmed to include the trigger net circuitry.

2. The apparatus of claim 1, wherein each of the plurality of programmable logic devices is a field-programmable gate array.

3. The apparatus of claim 1, wherein the trigger net circuitry includes at least one multiplexer with a select input coupled to a host interface of the prototyping system.

4. The apparatus of claim 3, wherein the host interface is configured to control the trigger net circuitry to output a high logic signal.

5. The apparatus of claim 1, wherein each register of the plurality of programmable logic devices synchronously outputs a control logic signal to the respective logic analyzer circuit coupled thereto.

6. The apparatus of claim 5, wherein each logic analyzer circuit of the plurality of programmable logic devices synchronously captures a waveform from the logic circuitry of the respective programmable logic device via the at least one logic connection.

7. The apparatus of claim 1, wherein each logic analyzer circuit of the plurality of programmable logic devices is programmed to synchronously capture a waveform from the logic circuitry of the respective programmable logic device via the at least one logic connection.

8. A computer-implemented method for synchronizing triggers for waveform capture of a prototyping system, the method comprising:
    partitioning a circuit design for programming into a plurality of programmable logic devices;
    programming at least one of the plurality of programmable logic devices to include trigger net circuitry, the trigger net circuitry including at least one trigger net and an output;
    programming an input of one register in each of the plurality of programmable logic devices to receive a control signal from the output of the trigger net circuitry; and
    programming an output of the one register in each of the plurality of programmable logic devices to transmit a trigger signal to a logic analyzer circuit in the respective programmable logic device.

9. The computer-implemented method according to claim 8, further comprising programming at least one logic connection of each logic analyzer circuit to receive at least one signal from logic circuitry of the respective programmable logic device.

10. The computer-implemented method according to claim 9, further comprising connecting a host interface of the prototyping system to an input of the trigger net circuitry.

11. The computer-implemented method according to claim 10, transmitting a control signal on the host interface to the trigger net circuitry to potentially output a high logic signal based on the logic programmed into the FPGA.

12. The computer-implemented method according to claim 11, further comprising synchronously outputting a control logic signal by each register of the plurality of programmable logic devices to the respective logic analyzer circuit coupled thereto.

13. The computer-implemented method according to claim 12, further comprising synchronously capturing, by each respective logic analyzer circuit, a waveform from the logic circuitry of the respective programmable logic device.

14. A computer-readable non-transitory storage medium having stored thereon a plurality of instructions, the plurality of instructions when executed by a computer, cause the computer to:
partition a circuit design for programming into a plurality of programmable logic devices;
program at least one of the plurality of programmable logic devices to include trigger net circuitry, the trigger net circuitry including at least one trigger net and an output;
program an input of one register in each of the plurality of programmable logic devices to receive a control signal from the output of the trigger net circuitry; and
program an output of the one register in each of the plurality of programmable logic devices to transmit a trigger signal to a logic analyzer circuit in the respective programmable logic device.

15. The computer-readable non-transitory storage medium according to claim 14, wherein the plurality of instructions when executed by a computer further cause the computer to program at least one logic connection of each logic analyzer circuit to receive at least one operating signal from logic circuitry of the respective programmable logic device.

16. The computer-readable non-transitory storage medium according to claim 15, wherein the plurality of instructions when executed by a computer further cause the computer to connect a host interface of the prototyping system to an input of the trigger net circuitry.

17. The computer-readable non-transitory storage medium according to claim 16, wherein the plurality of instructions when executed by a computer further cause the computer to transmit a control signal on the host interface to enable triggers and thereby potentially enable the trigger net circuitry to output a high logic signal.

18. The computer-readable non-transitory storage medium according to claim 17, wherein the plurality of instructions when executed by a computer further cause the computer to program each register of the plurality of programmable logic devices to synchronously output a control logic signal to the respective logic analyzer circuit coupled thereto.

19. The computer-readable non-transitory storage medium according to claim 16, wherein the plurality of instructions when executed by a computer further cause the computer to synchronously capture, by each respective logic analyzer circuit, a waveform from the logic circuitry of the respective programmable logic device.

* * * * *